(12) United States Patent
Yang et al.

(10) Patent No.: US 8,384,071 B2
(45) Date of Patent: Feb. 26, 2013

(54) ORGANIC LIGHT-EMITTING DIODES

(75) Inventors: Minyang Yang, Daejeon (KR);
Hongseok Youn, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 185 days.

(21) Appl. No.: 12/980,183

(22) Filed: Dec. 28, 2010

(65) Prior Publication Data
US 2011/0284825 A1 Nov. 24, 2011

(30) Foreign Application Priority Data
May 24, 2010 (KR) ................ 10-2010-0048136

(51) Int. Cl.
*H01L 51/52* (2006.01)
(52) U.S. Cl. ............................. 257/40; 257/13
(58) Field of Classification Search ............... 257/12–18, 257/40, 72–103, E39.007, E51.006
See application file for complete search history.

(56) References Cited

U.S. PATENT DOCUMENTS

| | | | | |
|---|---|---|---|---|
| 2010/0181561 A1* | 7/2010 | Kim et al. | ...................... | 257/40 |
| 2011/0140075 A1* | 6/2011 | Zhou et al. | ...................... | 257/13 |

OTHER PUBLICATIONS

Korean Office Action of the corresponding Korean Application No. 10-2010-0048136, dated Nov. 23, 2011.
L. Wang et al., "Utilization of water/alcohol-soluble polyelectrolyte as an electron injection layer for fabrication of high-efficiency multilayer saturated red-phoshorescence polymer light-emitting diodes by solution processing", Applied Physics Letters, vol. 89, pp. 151115-1~15115-3, October 10, 2006, the American Institute of Physics.
X.H. Yang et al., "Organic Light Emitting Diode Using Inorganic Material as Electron Transport Layer", Chinese Physics Letters, vol. 14, No. 12, pp. 946-948, Dec. 31, 1997, the Chinese Physical Society.

* cited by examiner

*Primary Examiner* — Cuong Q Nguyen
(74) *Attorney, Agent, or Firm* — Global IP Counselors, LLP (57) ABSTRACT

Disclosed is an organic light-emitting diodes including a ZnO nanoparticle and an ionic group. The organic light-emitting diodes according to the present invention includes:
a substrate formed of glass or a flexible plastic material;
an anode formed on the substrate;
a hole transport layer formed on the anode;
an emissive layer formed on the hole transport layer;
an electron transport layer being formed on the emissive layer and including a ZnO nanoparticle;
an electron injection layer being formed on the electron transport layer and including an ionic group; and
a cathode formed on the electron injection layer.

13 Claims, 2 Drawing Sheets

ORGANIC LIGHT-EMITTING DIODES

CROSS-REFERENCE TO RELATED APPLICATIONS

This U.S. National stage application claims priority under 35 U.S.C. §119(a) to Korean Patent Application No. 10-2010-0048136, filed in the Republic of Korea on May 24, 2010, the entire contents of which are hereby incorporated herein by reference.

BACKGROUND OF THE INVENTION

1. Field of the Invention

The present invention relates to a multi-layered organic light-emitting diodes.

2. Description of the Related Art

Recently, with a solution process applicable to not only a polymer organic light-emitting diodes but also a low molecular weight organic light-emitting diodes, many attempts are being made to apply a printing method to the solution process. The solution process includes an inkjet printing, a roll-to-roll printing, a screen printing, a spray coating and a dip coating and the like.

However, an anode and a cathode are still manufactured in vacuum by sputtering or evaporation. Since the aforesaid process requires a high-degree vacuum technology as well as very expensive process equipments, it is required that the number of vacuum deposition processes should be reduced, considering productivity and manufacturing cost.

An electron injection layer is formed by depositing an ultrathin film which is made of LiF, CsF, NaF and $Cs_2CO_3$ and has a thickness of about 1 nm. Otherwise, the electron injection layer is formed of a layer which is made of Ca, Li, Ba, Cs and Mg, etc., and has a thickness of about 20 nm. When a cathode is additionally deposited, the above layer is very vulnerable to oxygen and moisture in the outside air, so that the life span of the element is reduced. Moreover, these materials are not easy to handle during processing.

Since an ultrathin electron injection layer of the most used electron injection layer/cathode structure like LiF/Al uses a thin film of 0.5 to 2 nm, very important is a surface condition of coating film of an under layer on which the ultrathin electron injection layer is stacked. Therefore, since it is not easy to obtain a sufficient coating performance through the solution process such as a roll-to-roll coating, an inkjet printing, a screen printing, a spray coating and a dip coating, it is very difficult to apply the ultrathin electron injection layer to the solution process.

Meanwhile, in most conventional low molecular weight light-emitting diodes/polymer light-emitting diodes, the organic light-emitting diodes is manufactured by depositing a cathode in a high-degree vacuum through the use of an alkali metal or alkaline earth metal which has a low work function. When a metal having a high work function is used as a cathode, there is a problem that the performance of the organic light-emitting diodes is greatly reduced. When an alkali metal or alkaline earth metal which has a low work function is used as a cathode, such a cathode is vulnerable to oxygen and moisture in the air. Accordingly, it has been difficult to handle the cathode and a high-degree vacuum had to be maintained during the process.

As a result, when a cathode made of a metal having a high work function like Ag, Au and Al is used, an attempt is recently made to prevent the performance of the organic light-emitting diodes by mixing ammonium ion with a light emitting material or by coating an emissive layer with a polymer material having an ammonium ion group.

However, a polar solvent must be used for the polymer material having an ion group or an electrolytic ion complex having an ion group. Therefore, when the polar solvent is coated on an organic emissive layer, a polar polymer material having an ion group is agglomerated, and when the polar solvent is coated on a hydrophobic emissive layer, a aggregated coating degradation like stain occurs, so that the hydrophilic polymer material or an electrolytic ion complex, which has an ion group, is difficult to be applied to mass production due to their coating problems. Accordingly, in most cases, it is required that a material having an ion group be doped in or added to the emissive layer, and ions freely float within the emissive layer, which has a bad influence on the emission performance of the device.

SUMMARY OF THE INVENTION

An organic light-emitting diodes related to claim 1 comprises a substrate formed of glass or a flexible plastic material; an anode formed on the substrate; a hole transport layer formed on the anode; an emissive layer formed on the hole transport layer; an electron transport layer being formed on the emissive layer and including a ZnO nanoparticle; an electron injection layer being formed on the electron transport layer and including an ionic group; and a cathode formed on the electron injection layer.

Therefore, according to the organic light-emitting diodes related to claim 1, the organic light-emitting diodes including a ZnO nanoparticle and an ionic group is easily formed by using a solution process. Therefore, a high temperature heat treatment process is not performed, thereby having no influence on a light-emitting organic material vulnerable to heat. It is possible to increase the light emission efficiency of the organic light-emitting diodes and to protect the organic material from the external moisture and oxygen by using excellent electron injection properties and excellent electron transport properties of ion and ZnO nanoparticle within the electron injection layer. Since a solution process can be applied to layers as all as possible, the organic light-emitting diodes can be easily and inexpensively manufactured. In the organic light-emitting diodes related to claim 1, since a substrate made of a flexible plastic material, that is, a flexible substrate is used, it is possible to manufacture a flexible light-emitting diodes which can be curved and adhered to variously curved surfaces.

An organic light-emitting diodes related to claim 2 comprises a substrate formed of glass or a flexible device; a cathode formed on the substrate; an electron injection layer being on the cathode and including an ionic group; an electron transport layer formed on the electron injection layer and including a ZnO nanoparticle; an emissive layer formed on the electron transport layer; a hole transport layer formed on the emissive layer; and an anode formed on the hole transport layer.

Therefore, according to the organic light-emitting diodes related to claim 2, the organic light-emitting diodes which is formed by inverting the layers of the organic light-emitting diodes related to claim 1 and which includes a ZnO nanoparticle and an ionic group is easily formed by using a solution process. Therefore, a high temperature heat treatment process is not performed, thereby having no influence on a light-emitting polymer flexible substrate vulnerable to heat. It is possible to increase the light emission efficiency of the organic light-emitting diodes and to inexpensively manufacture the organic light-emitting diodes by using excellent electron injection properties and excellent electron transport properties of ion and ZnO nanoparticle as the electron injection layer. In the organic light-emitting diodes related to claim 2, since a substrate made of a flexible plastic material, that is, a flexible substrate is used, it is possible to manufacture a flexible light-emitting diodes which can be curved and adhered to variously curved surfaces.

Based on the organic light-emitting diodes related to claim 1 or 2, in an organic light-emitting diodes related to claim 3, the hole transport layer is dissolved in a liquid phase by using any one of poly (3,4-ethylenedioxythiophere) poly (styrene sulfonate) (PEDOT:PSS), poly (9-vinylcarbazole) (PVK), poly (9,9-dioctylfluorenyl-2,7-diyl)-co-(4,4'(N-(4-sec-butylphenyl)) diphenylamine) (TFB), N,N'-diphenyl-N,N'-bis (1-naphthyl)-1,1'biphenyl-4,4'-diamine (a-NPD), N,N'-Bis-(3-methylphenyl)-N,N-Bis-phenyl(1,1'-biphenyl)-4,4'-diamine (TPD), so that a solution process such as a printing process is applicable.

Therefore, according to the organic light-emitting diodes related to claim 3, holes supplied from the anode are easily transferred and injected to the emissive layer, so that the performance of the device is improved. The hole transport layer is formed in a liquid phase in which the holes are dissolved in a solvent.

Based on the organic light-emitting diodes related to claim 1 or 2, in an organic light-emitting diodes related to claim 4, the emissive layer is either formed of any one of poly (p-phenylenevinylene) (PPV), poly (p-phenylene) (PPP), polythiophene (PT), polyfluorene (PF), poly (9.9-dioctylfluorene) (PFO) and poly (9-vinylcarbazole) (PVK) and its derivative of a polymer material, or formed of a low molecular weight material including metal complexes of Al complex series, Ir complex series or Pt complex series.

Therefore, according to the organic light-emitting diodes related to claim 4, after a solution is formed by dissolving a particular polymer material or a particular low molecular weight material in a particular solvent, the emissive layer is formed by using a solution process and the like.

Based on the organic light-emitting diodes related to claim 1 or 2, in an organic light-emitting diodes related to claim 5, the electron transport layer includes a ZnO nanoparticle.

Based on the organic light-emitting diodes related to claim 1 or 2, in an organic light-emitting diodes related to claim 6, after a solution is obtained by dissolving an electrolyte or an ionic surfactant including the cation and anion of an alkali metal or alkaline earth metal in a polar solvent or non-polar solvent, the electron injection layer is formed by coating the solution in a liquid phase.

Therefore, according to the organic light-emitting diodes related to claim 6, the electron injection layer is formed by using a solution obtained by dissolving the ionic surfactant in the polar solvent or non-polar solvent, so that it is possible to increase an effect of electron injection from the cathode to the electron injection layer.

Based on the organic light-emitting diodes related to claim 1 or 2, in an organic light-emitting diodes related to claim 7, the electron injection layer is formed by using a solution obtained by dissolving a surfactant or a polymer electrolyte in a polar solvent or non-polar solvent.

Based on the organic light-emitting diodes related to claim 7, in the electron injection layer of an organic light-emitting diodes related to claim 8, an organic material which includes an alkali metal ion or an alkaline earth metal ion and salts thereof or which includes an organic cation is further added to the surfactant or a polymer electrolyte solution.

Therefore, according to the organic light-emitting diodes related to claim 8, the electron injection layer is formed in a liquid phase by using said solution, thereby increasing an effect of electron injection.

Based on the organic light-emitting diodes related to claim 7, in an organic light-emitting diodes related to claim 9, the surfactant is non-ionic having an ethylene oxide, and wherein the polymer electrolyte is a polymer of the surfactant, i.e., polyethylene oxide (PEO) and polyethylene glycol (PEG).

Therefore, according to the organic light-emitting diodes related to claim 9, an electrolyte which helps the ions within the electron injection layer to easily move by using a solution obtained by dissolving in a solvent both the non-ionic surfactant having ethylene oxide and the polymer electrolyte, that is, a polymer of the surfactants, like polyethylene oxide (PEO) and polyethylene glycol (PEG). In particular, the polyethylene oxide (PEO) and polyethylene glycol (PEG) and the like are polymer electrolytes and increase the mobility of the ions by being added with the ions within the electron injection layer, thereby maximizing the effect transferring the electrons to the ZnO nanoparticle of the electron transport layer. The ZnO nanoparticle transfers the electron received from the electrolyte to the emissive layer, increasing significantly the efficiency of the element. That is, the ionic electron injection layer is formed by using the polar solvent and an electrolytic ion including the electrolyte and an ionic group. An ionic material including a ionic group is used as the electrolyte ion. Here, the ionic group includes a metal ion like Li+, Na+, Cs+, K+, Ba+, Ca++, Mg++ and more preferably an organic ion. The electron injection effect can be increased by adding an organic material including ammonium salts such as phenyl ammonium, tetramethyl ammonium, tetrapropyl ammonium, tetraethyl ammonium, tetrabutyl ammonium, tetrabutylammonium tetrafluoroboate, tetrakis(dimethylamino)ethylene and imidazolium and the like.

Based on the organic light-emitting diodes related to claim 1 or 2, in an organic light-emitting diodes related to claim 10, the electron injection layer is formed by using a metal ion, and wherein the metal ion forms the ZnO nanoparticle of the electron transport layer and compounds such as ZnO:Cs, ZnO:Li, ZnO:Mg, ZnO:Al, ZnO:Ca, ZnO:Na and ZnO:Ba.

Therefore, according to the organic light-emitting diodes related to claim 10, with respect to the electron injection layer, the electron injection effect can be improved by doping a metal material in the ZnO nanoparticle through the use of adding a metal ion to ZnO, and can be improved by using a form of ZnO:Cs through the mixture of a ZnO nanoparticle solution and a solution in which a metal ion to be doped is dissolved. Here, the metal ion corresponds to Li+, Na+, Cs+, K+, Ba+, Ca++ and Mg++, which are formed from the dissolution of metal salts in a solvent.

Based on the organic light-emitting diodes related to claim 1 or 2, in an organic light-emitting diodes related to claim 11, the electron injection layer is formed by using an ionic polymer material having an organic material, which comprises an alkali metal ion or an alkaline earth metal ion and salts thereof, or, which includes an organic cation such as an ammonium ion, as an ionic group.

Therefore, according to the organic light-emitting diodes related to claim 11, the electron injection layer is formed by using an ionic polymer material including an ionic group. Here, the ionic group includes a metal ion like Li+, Na+, Cs+, K+, Ba+, Ca++, Mg++ and more preferably an organic ion. The electron injection effect can be increased by adding an organic material including ammonium salts such as phenyl ammonium, tetramethyl ammonium, tetrapropyl ammonium, tetraethyl ammonium, tetrabutyl ammonium, tetrabutylammonium tetrafluoroboate, tetrakis(dimethylamino)ethylene and imidazolium and the like.

Based on the organic light-emitting diodes related to claim 1 or 2, in an organic light-emitting diodes related to claim 12, the cathode is formed in vacuum through a deposition process by using metal ink in the form of either ionized metal or metal colloidized in a liquid and by using metal nano ink including metal nano component. The metal corresponds to any one of Ag, Al, Au, Ca, Mg, Li and Cs.

Therefore, according to the organic light-emitting diodes related to claim 12, the cathode is formed in a liquid phase by ionizing and stabilizing or by colloidizing the metal like Ag, Al, Au, Ca, Mg, Li and Cs. The performance of the cathode can be improved by forming the electron injection layer together.

Based on the organic light-emitting diodes related to claim 1 or 2, in an organic light-emitting diodes related to claim 13, the cathode is formed by using a transparent metal oxide including any one of Indium Tin Oxide (ITO), Fluorine-doped Tin Oxide (FTO), Antimony Tin Oxide (ATO), Aluminum doped Zinc Oxide (AZO) and Indium Zinc Oxide (IZO) through a deposition process or a solution process.

Therefore, according to the organic light-emitting diodes related to claim 13, the cathode is formed by using a transparent metal oxide such as ITO, FTO, ATO, AZO and IZO, improving the light emission efficiency of the organic light-emitting diodes.

Based on the organic light-emitting diodes related to claim 1 or 2, in an organic light-emitting diodes related to claim 14, the substrate is formed of a plastic material including any one of polyethylene terephthalate (PET), polyester (PES), polythiophene (PT) and polyimide (PI), or is formed of a flexible material such as aluminum foil and stainless steel foil, so that the substrate has flexibility.

Therefore, according to the organic light-emitting diodes related to claim 14, a flexible light-emitting diodes can be manufactured.

An organic light-emitting diodes related to claim 15 comprises a substrate formed of glass or a flexible plastic material; an anode formed on the substrate; a hole transport layer formed on the anode; an emissive layer formed on the hole transport layer; an electron injection transport layer being formed on the emissive layer and including a ZnO nanoparticle and an ionic group; and a cathode formed on the electron injection transport layer.

Therefore, according to the organic light-emitting diodes related to claim 15, the organic light-emitting diodes including a ZnO nanoparticle and an ionic group is easily formed through a solution process by merging the electron injection layer and the electron transport layer into one layer. Therefore, a high temperature heat treatment process is not performed, thereby having no influence on a light-emitting organic material vulnerable to heat. It is possible to increase the light emission efficiency of the light-emitting diodes by using excellent electron transport properties of ion and ZnO nanoparticle within the electron injection layer, and possible to inexpensively manufacture the organic light-emitting diodes. As compared with an organic light-emitting diodes of which the electron injection layer and the electron transport layer are separately formed, the electron injection layer and the electron transport layer of the organic light-emitting diodes according to the present invention can be relatively simply formed.

An organic light-emitting diodes related to claim 16 comprises a substrate formed of glass or a flexible device; a cathode formed on the substrate; an electron injection transport layer being formed on the cathode and including an ionic group and a ZnO nanoparticle; an emissive layer formed on the electron injection transport layer; a hole transport layer formed on the emissive layer; and an anode formed on the hole transport layer.

Therefore, according to the organic light-emitting diodes related to claim 16, the organic light-emitting diodes which is formed by inverting the layers of the organic light-emitting diodes related to claim 15 and by merging the electron injection layer and the electron transport layer into one layer and which includes a ZnO nanoparticle and an ionic group is easily formed by using a solution process. Therefore, a high temperature heat treatment process is not performed, thereby having no influence on a light-emitting polymer flexible substrate vulnerable to heat. It is possible to increase the light emission efficiency of the light-emitting diodes by using excellent electron transport properties of ion and ZnO nanoparticle within the electron injection transport layer, and possible to inexpensively manufacture the organic light-emitting diodes.

DETAILED DESCRIPTION OF THE PREFERRED EMBODIMENTS

Hereinafter, an embodiment of the present invention will be described with reference to the accompanying drawings. The embodiment of the present invention can be variously transformed, and the scope of the present invention is not limited to the following embodiment. The shapes and sizes of the components in the drawings may be exaggerated for clarity of the description. The components indicated by the same reference numerals in the drawing correspond to the same components.

In the present invention, an organic light-emitting diodes is classified into four kinds. That is, a first organic light-emitting diodes is formed by forming, on a substrate, an anode, a hole transport layer (a hole transport layer can be also called as a hole injection layer), an emissive layer, an electron transport layer, an electron injection layer and a cathode in the order listed. A second organic light-emitting diodes is formed by inverting the layers formed on the substrate of the first organic light-emitting diodes. A third organic light-emitting diodes is formed by merging the electron injection layer and the electron transport layer of the first organic light-emitting diodes into one electron injection transport layer. A fourth organic light-emitting diodes is formed by merging the electron injection layer and the electron transport layer of the second organic light-emitting diodes into one electron injection transport layer.

Figure 1:
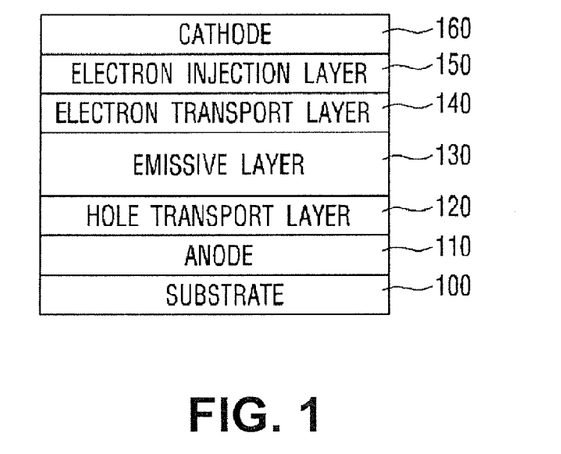
FIG. 1 is a cross sectional view of a first organic light-emitting diodes of the present invention.

FIG. 1 is a cross sectional view of a first organic light-emitting diodes of the present invention. As shown in FIG. 1, the first organic light-emitting diodes comprises a substrate 100, an anode 110, a hole transport layer 120, an emissive layer 130, an electron transport layer 140, an electron injection layer 150 and a cathode 160. The first organic light-emitting diodes is formed in the order of the substrate 100, the anode 110, the hole transport layer 120, the emissive layer 130, the electron transport layer 140, the electron injection layer 150 and the cathode 160 from the bottom thereof. Hereinafter, each of these will be described in detail.

The substrate 100 is formed of glass or a flexible plastic material. When the substrate 100 is formed of a flexible plastic material, the flexible plastic material includes any one of polyethylene terephthalate (PET), polyester (PES), polythiophene (PT) and polyimide (PI) or is formed of a flexible material such as aluminum foil and stainless steel foil, so that the substrate 100 has flexibility. Here, the substrate formed of a flexible plastic material is used to form predetermined layers of the substrate 100 by using a roll-to-roll printing.

The anode 110 is formed on the substrate 100. The anode 110 is constituted by a conductive polymer material, single-walled carbon nanotubes (SWCNT) OR Multi-walled carbon nanotubes (MWCNT) and generates an electron hole. Meanwhile, the anode 110 is mainly formed of a metal oxide of indium tin oxide (ITO). However, there are small deposits of the indium in earth, so that the indium is expensive and rare metal. The indium is stacked in vacuum by sputtering. Therefore, in order to form the anode 110 through a solution process and a printing process, an electrode material is required to be in the form of a solution or a printable paste. ITO can be liquefied by a sol-gel synthesis or a spray pyrolysis. However, the above method requires a temperature higher than 400□, so that the above method cannot be used to manufacture a flexible organic light-emitting diodes using the flexible substrate 100. Since a glass substrate 100 permits a high temperature process, it is also possible to use a sol-gel solution.

For example, the anode 110 is formed by using a printing method at a normal temperature. The anode 110 may be formed by using a conductive polymer material. Here, since the polymer material does not have electrical conductivity as much as it can be used as the anode 110, the polymer material needs a method for improving the electrical conductivity. The electrical conductivity can be improved by adding a predetermined a solution to the polymer material. The conductive polymer material includes poly (3,4-ethylenedioxythiophere) poly (styrene sulfonate) (PEDOT:PSS) with the addition of any one of dimethyl sulfoxide (DMSO), polycarbonates (PC), dimethyl formamide (DMF), hexamethyl phosphorotriamide (HMPA), tetrahydrofuran (THF), ethylene glycol (EG), N-Methyl-2-pyrrolidone (NMP).

Here, the following process is performed to use the PEDOT:PSS having a maximized electrical conductivity. First, a PEDOT:PSS solution is manufactured to have an electrical conductivity improved by poly (3,4-ethylenedioxythiophere) poly (styrene sulfonate) (PEDOT:PSS) of 95% with the addition of any one of dimethyl sulfoxide (DMSO) of 5%, polycarbonates (PC), dimethyl formamide (DMF), hexamethyl phosphorotriamide (HMPA), tetrahydrofuran (THF) and ethylene glycol (EG). Then, the anode 110 is formed by coating the PEDOT:PSS solution.

For another example, for the purpose of forming the anode 110 by applying a printing method at a normal temperature, single-walled carbon nanotubes (SWCNT) or multi-walled carbon nanotubes (MWCNT) can be used. According to the above method, the SWCNT or the MWCNT is dispersed in a solvent, and then the anode 110 is formed with the dispersed solvent. Additionally, a surfactant may be added as a dispersant so as to uniformly disperse the SWCNT in the solvent.

The hole transport layer 120 (a hole transport layer 120 can be also called as a hole injection layer) is formed on the anode 110. The hole transport layer 120 injects electron holes generated from the anode 110 and transports to the emissive layer 130, and is formed between the emissive layer 130 and the anode 110. The hole transport layer 120 can be formed by using a solution process such as a printing process dissolving in a liquid phase any one of PEDOT:PSS, poly (9-vinylcarbazole) (PVK), poly (9,9-dioctylfluorenyl-2,7-diyl)-co-(4,4' (N-(4-sec-butylphenyl)) diphenylamine) (TFB), Copper Phthalocyanine (CuPc) or any one of N,N'-diphenyl-N,N'-bis (1-naphthyl)-1,1'biphenyl-4,4'-diamine (a-NPD), N,N'-Bis-(3-methylphenyl)-N,N'-Bis-phenyl(1,1'-biphenyl)-4,4'-diamine (TPD).

The emissive layer 130 is formed on the hole transport layer 120. The emissive layer 130 emits light through the recombination of electrons and electron holes which have been injected and transported from the cathode 160 and the anode 110. The light emitting material thereof includes a liquefiable polymer material or a liquefiable low molecular weight material. In addition, a fluorescent material and a phosphorescence material are used according to the light emitting principle of the emissive layer 130. The emissive layer 130 is either formed of any one of poly (p-phenylenevinylene) (PPV), poly (p-phenylene) (PPP), polythiophene (PT), polyfluorene (PF), poly (9.9-dioctylfluorene) (PFO) and poly (9-vinylcarbazole) (PVK) and its derivative of a polymer material, or formed of a low molecular weight material including a metal complex such as Tris (8-hydroxyquinolinato) aluminium (Alq3) of Al complex series, Ir(ppy)3(fac-tris(2-phenylpyridinato) iridium (III)) of Ir complex series or PtOEP (2,3,7,8,12,13,17,18-octaethyl-12H, 23H-porphyrine platinum (II)) of Pt complex series. Moreover, there provides a polymer material of poly (9-vinylcarbazole) (PVK) with the addition of a low molecular weight phosphorescence material.

The electron transport layer 140 transports the electrons which have been injected to the electron injection layer 150 to the emissive layer 130. The electron transport layer 140 is formed on the emissive layer 130, and blocks the electron holes transported from the hole transport layer 120 through the emissive layer 130. Here, the electron transport layer 140 includes liquefiable ZnO nanoparticles or liquefiable TiOx nanoparticles. The electron transport layer 140 transports the electrons which have been injected to the electron injection layer 150 to the emissive layer 130, and is added to increase the efficiency of the element.

Particularly, the ZnO nanoparticle layer and the TiOx nanoparticle layer not only transport the electron holes but also block the electron holes, and also protect the internal emissive layer 130 from the external moisture and oxygen. Though there is a commonly known sol-gel method for stacking the layers through the solution process, the sol-gel method cannot be directly used due to a coating problem with a hydrophobic emissive layer and the requirement for a temperature higher than 200° C.

Particularly, the ZnO nanoparticle layer also offers a good hydrophilic surface so that the ionic solution can be easily coated. In addition, The ZnO nanoparticle and ionic interlayer improve the electron injection properties from the aluminum cathode into the emissive layer forming an interface dipole within the ZnO nanoparticle and ionic interlayer. In more detail, the ammonium cations move toward the cathode and the anions align on the opposite side within the electron-injection layer under the electric field. The permanent interfacial dipole screens the emissive layer from the electric field and then lowers the large energy barrier to a point equal to the difference between lowest unoccupied molecular orbital (LUMO) levels of the emitting polymer and the high work-function of the Al cathode. The interface dipole formed by the ions aligned along the opposite side is facilitated by the accumulated holes. This creates more of a charge balance within the emissive layer, which increases the efficiency of the device remarkably.

In order to solve the above problems, particles of ZnO nanocrystal are dispersed in a solvent which does not damage the emissive layer, so that the present invention uses the dispersed solution capable of being coated. This method does not require a high temperature after coating and has no particular influence on the organic light-emitting diodes. Meanwhile, the ZnO nanoparticle is able to easily transfer the electrons from the electron injection layer.

The electron injection layer 150 is formed on the electron transport layer 140 of the ZnO nanoparticle layer and includes an ionic group. The electron injection layer 150 may be formed between the cathode 160 and the electron transport layer 140 such that the electron more effectively flows from the cathode 160 into the inside of the organic light-emitting diodes.

After a solution is obtained by dissolving an electrolyte or an ionic surfactant including the cation and anion of an alkali metal or alkaline earth metal in a polar solvent or non-polar solvent, the electron injection layer 150 is formed by coating the solution in a liquid phase. The electron injection layer 150 is also formed by using a solution obtained by dissolving the surfactant or a polymer electrolyte in a polar solvent or non-polar solvent. In this case, an organic material such as polymer and organic molecular which includes an alkali metal ion or an alkaline earth metal ion and salts thereof or includes an organic cation may be further added to the surfactant or a polymer electrolyte solution. The surfactant is non-ionic having an ethylene oxide. The polymer electrolyte is a polymer of the surfactant, i.e., polyethylene oxide (PEO) and polyethylene glycol (PEG). The ethylene oxide determines the property of the surfactant which is more polarized due to the increase of the number of its molecules. That is, the ethylene oxide includes a lot of lone pair electrons, thereby increasing an effect of electron injection from the cathode 160 to the electron injection layer 150. Here, the ionic surfactant is formed by adding cations such as $Li^+$, $Na^+$, $Cs^+$, $K^+$, $Ca^{++}$ and $Mg^{++}$ and anions such as sulfate ($SO^{3-}$) or phosphate ($PO^{2-}$) of the alkali metal or alkaline earth metal to a surfactant including a non-ionic ethylene oxide. The ionic surfactant is liquefied by being dissolved in a polar solvent or non-polar solvent. The non-ionic surfactant includes any one of polyethylene oxide (PEO) and polyethylene glycol (PEG) which are classified according to their molecular weights, and functions as an electrolyte. The electrolyte activates ion movements. The non-ionic surfactant is liquefied by being dissolved in a polar solvent or non-polar solvent. Salts including the alkali metal or alkaline earth metal (e.g., Li, Na, Cs, K, Ca and Mg) are added to the non-ionic surfactant, thereby increasing an effect of electron injection.

The electron injection layer 150 is also formed by using an ionic polymer material having an organic material, which includes an alkali metal ion or an alkaline earth metal ion and salts thereof, or, which includes an organic cation such as an ammonium ion, as an ionic group.

Specifically, the electron injection layer 150 is formed through the addition of an electrolyte solution formed by dissolving the polyethylene oxide (PEO) and polyethylene glycol (PEG), that is, non-ionic surfactants, in a solvent, and through the addition of either a salt including an alkali metal or an alkaline earth metal which has ionic groups adding ions to the electrolyte solution, or an organic salt including the organic cation. Preferably, it is possible to increase the effect of electron injection by adding an organic material including ammonium salts of organic cations such as ammonium salts such as phenyl ammonium, tetramethyl ammonium, tetrapropyl ammonium, tetraethyl ammonium, tetrabutyl ammonium, tetrabutylammonium tetrafluoroboate, tetrakis(dimethylamino)ethylene and imidazolium and the like in the electrolyte solution formed by dissolving the non-ionic surfactant in a polar solvent or non-polar solvent.

Further, the electron injection layer 150 may be formed by using a metal ion. The metal ion forms the ZnO nanoparticle of the electron transport layer and compounds such as ZnO:Cs, ZnO:Li, ZnO:Mg, ZnO:Al, ZnO:Ca, ZnO:Na and ZnO:Ba. According to the method for forming the electron injection layer 150 by using the metal ion, LiF, CsF, NaF, $Cs_2CO_3$, $Ca(acac)_2$ and the like of the salt of the liquefiable alkali metal and liquefiable alkaline earth metal are dissolved in a polar solvent, and then this solution is used to form the electron injection layer 150. According to a method using a depositing metallic material as the electron injection layer, the alkali metal and alkaline earth metal such as Ca, Na, Mg, Li, Ba and Cs and the like and LiF, CsF, NaF, $Cs_2CO_3$, $Ca(acac)_2$ of a salt form are deposited. An example that the electron injection layer 150 of the first organic light-emitting diodes is formed by using the metal ion as mentioned above will be described in the following embodiment 1.

[Embodiment 1]

Anode: manufactured with indium tin oxide (ITO) glass, deionized water, acetone and isopropyl alcohol (IPA) are put into three beakers respectively, and ultrasonic cleaning is performed for 5 minutes by an ultrasonic cleaner. Then, washing and surface treatment are performed for one hour by using an ozone ultraviolet lamp of an ozone handler.

Hole transport layer: A PEDOT:PSS solution is dropped on the ITO glass, a spin coating is performed at 2000 rpm for 40 seconds, and then a heat treatment process is performed at a temperature of 200° C. for 5 minutes on a hot plate.

Emissive layer: phenyl substituted poly_para-phenylene vinylene known as "Super Yellow" (0.65 w % into toluene) or $F_8BT$ of light-emitting polymer is added to a toluene solution of 1 w %, a spin coating is performed for 30 seconds, and then baking is performed at a temperature of 70° C. for 1 hour on a hot plate.

Electron transport layer: ZnO nanoparticle of 60 mg/mm is put into 1-butanol, a spin coating is performed on the dispersed solution at 2000 rpm for 30 seconds, and then baking is performed at a temperature of 80° C. for 30 minutes.

Electron injection layer: A spin coating is performed at 4000 rpm for 30 seconds on a solution in which PFN (Poly [9,9-bis[6-(N,N,N-trimethylammonium)-hexyl]fluorene-alt-co-phenylene]) polymer 0.2 w % dimethyl formamide (DMF) including ammonium ion is dissolved, and then baking is performed at a temperature of 80° C. for 30 minutes.

Cathode: Silver (Ag) of 150 nm is deposited on the electron injection layer.

With respect to the electron injection layer 150, the electron injection effect can be increased not only by adding an organic polymer material and organic low molecular weight material which include ammonium salts or an organic polymer material and organic low molecular weight material which include amino group, but also by using the surfactant and organic salts of ammonium series. This corresponds to the following description of embodiment 2.

The electron injection layer 150 is formed by using an ionic polymer material including an ionic group, and is also formed by using an n-type polymer material or an n-type low molecular weight material. An example that the electron injection layer 150 of the first organic light-emitting diodes is formed by using the ionic polymer material including an ionic group will be described in the following embodiment 2.

[Embodiment 2]

Anode: manufactured with indium tin oxide (ITO) glass, deionized water, acetone and isopropyl alcohol (IPA) are put into three beakers respectively, and ultrasonic cleaning is performed for 5 minutes by an ultrasonic cleaner. Then, washing and surface treatment are performed for one hour by using an ozone ultraviolet lamp of an ozone handler.

Hole transport layer: A PEDOT:PSS solution is dropped on the ITO glass, a spin coating is performed at 2000 rpm for 40 seconds, and then a heat treatment process is performed at a temperature of 200° C. for 5 minutes on a hot plate.

Emissive layer: phenyl substituted poly_para-phenylene vinylene known as "Super Yellow" (0.65 w % into toluene) or $F_8BT$ of light-emitting polymer is added to a toluene solution of 1 w %, a spin coating is performed for 30 seconds, and then baking is performed at a temperature of 70° C. for 1 hour on a hot plate.

Electron transport layer: ZnO nanoparticle of 60 mg/mm is put into 1-butanol, a spin coating is performed on the dispersed solution at 2000 rpm for 30 seconds, and then baking is performed at a temperature of 80° C. for 30 minutes.

Electron injection layer: An ionic electrolyte (electrolyte, solvent and electrolytic ion) including an ammonium ion are used. Electrolyte of polyethylene oxide (PEO) of 20 mg and electrolytic ion of trtra-n-butylammonium tetrafluoroborate (TBABF4) of 8 mg are dissolved in a solvent of acetonitile (MeCN) of 4 g, a spin coating is performed at 4000 rpm for 30 seconds on the solution, and then baking is performed at a temperature of 80° C. for 30 minutes.

Cathode: Silver (Ag) of 150 nm is deposited on the electron injection layer.

The cathode 160 is formed on the electron injection layer 150. The cathode 160 supplies electrons to the device and is formed in a nitrogen or argon atmosphere through the solution process by using metal ink in the form of either ionized metal or metal colloidized in a liquid and by using metal nano ink including metal nano component. Preferably, a metal ink which is stable in the air is formed by a solution process, that is, a printing. However, the cathode of the alkali metal or alkaline earth metal is formed in vacuum by using a vacuum evaporation process such as thermal evaporation if necessary. The metal corresponds to any one of Ag, Al, Au, Ca, Mg, Li and Cs.

A metallic material used as a conventional cathode 160 is difficult to be oxidized, for example, Al, Ca, Mg, Li and Cs and the like. Here, these metallic materials had to be deposited in high-degree vacuum by using a chemical vaporized deposition method.

In the present invention, through a solution process or a paste process, the cathode 160 is formed of a metallic material used as the conventional cathode 160. Here, though after the cathode 160 including Ca, Mg and Li, etc., which are unstable in the air, is stabilized through an ion process and a solution process or a paste process, the cathode 160 is easily oxidized and the performance of the cathode 160 is degraded. Accordingly, numbers of functional layers are formed on the cathode 1160, so that the cathode 160 is protected from moisture or oxygen. Particularly, the cathode 160 including Ag, Al and Au and the like which are relatively stable is formed in an ionized state or in the form of ink including metal nanoparticle component through the solution process. Specifically, in the present invention, the metal used as a material of the conventional cathode 160 is used in an ionized state or in the form of metal ink colloidized in a liquid and in the form of ink including metal nanoparticle component, so that the solution process becomes available. Moreover, in the present invention, the cathode 160 can be formed by using a metal oxide through a deposition process as well as the solution process.

The ionized metal is formed by using at least any one of Ag, Al, Au, Ca, Mg, Li and Cs through a deposition process in vacuum, or is formed by performing the deposition process or a solution process on the metal oxide. The alkali metal or alkaline earth metal is also used. Here, the cathode 160 is formed by using the ionized metal one by one or an alloy including the ionized metal.

The metal used to form the cathode is dissolved in a solution and ionized. Here, the solvent included in the solution is evaporated by heat supplied from the outside, and only the ionized metal material of a solute is coated on the substrate 100. Here, when a material which is stable in the air, for example, Ag, Au and Al and the like are used as the cathode 160, it is desirable that a functional layer like the electron injection layer 150 should be formed on the cathode 160 in order to increase the efficiency of the cathode 160.

The metal ink material includes at least any one of Ag ink, Al ink, Au ink, Ca ink, Mg ink, Li ink and Cs ink. The metallic material included in the metal ink material is ionized in the solution. When the metallic material is thinly coated on the substrate 100, an almost transparent cathode 160 is formed. Here, in obtaining transparency of the cathode 160 with the metal ink material, it is required that the cathode 160 should be formed to have a thickness within 20 nm.

Regarding a transparent light-emitting diodes, the transparent cathode 160 is formed by using a transparent metal oxide including any one of Indium Tin Oxide (ITO), Fluorine-doped Tin Oxide (FTO), Antimony Tin Oxide (ATO), Aluminum doped Zinc Oxide (AZO) and Indium Zinc Oxide (IZO) through a deposition process or a solution process. Here, though ITO is generally used to form the anode 110, the organic light-emitting diodes of the present invention uses the ITO as a material for forming the cathode 160, so that it is possible to improve the light emission efficiency of the transparent organic light-emitting diodes by using the ZnO nanoparticle layer, electrolyte and an ionic electron injection layer.

Figure 2:
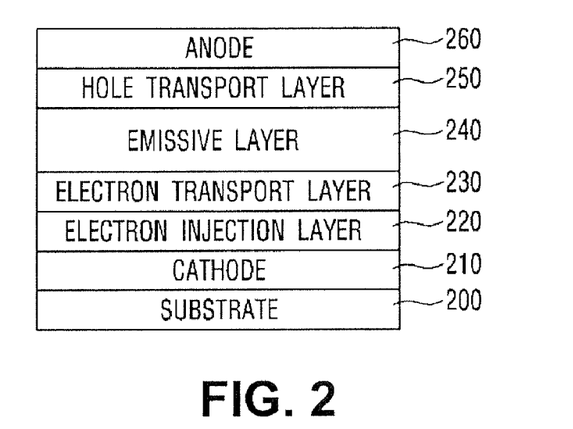
FIG. 2 is a cross sectional view of a second organic light-emitting diodes of the present invention.

FIG. 2 is a cross sectional view of a second organic light-emitting diodes of the present invention. As shown in FIG. 2, the second organic light-emitting diodes comprises a substrate 200, a cathode 210, an electron injection layer 220, an electron transport layer 230, an emissive layer 240, a hole transport layer 250 and an anode 260. The second organic light-emitting diodes is formed in the order of the cathode 210, the electron injection layer 220, the electron transport layer 230, the emissive layer 240, the hole transport layer 250 and the anode 260 from the bottom thereof. That is, the second organic light-emitting diodes is formed by inverting the layers formed on the substrate 10 of the first organic light-emitting diodes. Since each of the components which will be described in FIG. 2 is the same as each of components which has been described in FIG. 1, the description of FIG. 1 will be applied with respect to the omitted description of FIG. 2.

Meanwhile, in the present invention, the second organic light-emitting diodes of FIG. 2 is implemented through the following embodiments 3 and 4. An embodiment 3 shows that the electron injection layer is manufactured by using an ionic polymer. An embodiment 4 shows that the electron injection layer is manufactured by using ionic electrolyte. The embodiment 3 and 4 are implemented by inverting the embodiments 1 and 2 respectively.

An example of forming the electron injection layer 220 of the second organic light-emitting diodes by using metal ion will be described in the following embodiment 4.

[Embodiment 3]

Cathode: manufactured with indium tin oxide (ITO) glass, deionized water, acetone and isopropyl alcohol (IPA) are put into three beakers respectively, and ultrasonic cleaning is performed for 5 minutes by an ultrasonic cleaner. Then, washing and surface treatment are performed for one hour by using an ozone ultraviolet lamp of an ozone handler.

Electron injection layer: A spin coating is performed at 4000 rpm for 30 seconds on a solution in which PFN (Poly[9,9-bis[6-(N,N,N-trimethylammonium)-hexyl]fluorene-alt-co-phenylene]) polymer 0.2 w % dimethyl formamide (DMF) including ammonium ion is dissolved, and then baking is performed at a temperature of 80° C. for 30 minutes.

Electron transport layer: ZnO nanoparticle of 60 mg/mm is put into 1-butanol, a spin coating is performed on the dispersed solution at 2000 rpm for 30 seconds, and then baking is performed at a temperature of 80° C. for 30 minutes.

Emissive layer: phenyl substituted poly_para-phenylene vinylene known as "Super Yellow" (0.65 w % into toluene) or F8BT of light-emitting polymer is added to a toluene solution of 1 w %, a spin coating is performed for 30 seconds, and then baking is performed at a temperature of 70° C. for 1 hour on a hot plate.

Hole transport or hole injection layer: $M_oO_3$ of 20 nm is deposited on the emissive layer.

Anode: Silver (Ag) of 150 nm is deposited on the electron transport layer.

An example of forming the electron injection layer 220 of the second organic light-emitting diodes by using an ionic polymer material including an ionic group will be described in the following embodiment 4.

[Embodiment 4]

Cathode: manufactured with indium tin oxide (ITO) glass, deionized water, acetone and isopropyl alcohol (IPA) are put into three beakers respectively, and ultrasonic cleaning is performed for 5 minutes by an ultrasonic cleaner. Then, washing and surface treatment are performed for one hour by using an ozone ultraviolet lamp of an ozone handler.

Electron injection layer: An ionic electrolyte (electrolyte, solvent and electrolytic ion) including an ammonium ion are used. Electrolyte of polyethylene oxide (PEO) of 20 mg and electrolytic ion of trtra-n-butylammonium tetrafluoroborate (TBABF4) of 8 mg are dissolved in a solvent of acetonitile (MeCN) of 4 g, a spin coating is performed at 4000 rpm for 30 seconds on the solution, and then baking is performed at a temperature of 80° C. for 30 minutes.

Electron transport layer: ZnO nanoparticle of 60 mg/mm is put into 1-butanol, a spin coating is performed on the dispersed solution at 2000 rpm for 30 seconds, and then baking is performed at a temperature of 80° C. for 30 minutes.

Emissive layer: phenyl substituted poly_para-phenylene vinylene known as "Super Yellow" (0.65 w % into toluene) or $F_8BT$ of light-emitting polymer is added to a toluene solution of 1 w %, a spin coating is performed for 30 seconds, and then baking is performed at a temperature of 70° C. for 1 hour on a hot plate.

Hole transport layer: $M_oO_3$ of 20 nm is deposited on the emissive layer.

Anode: Silver (Ag) of 150 nm is deposited on the electron injection layer.

Figure 3:
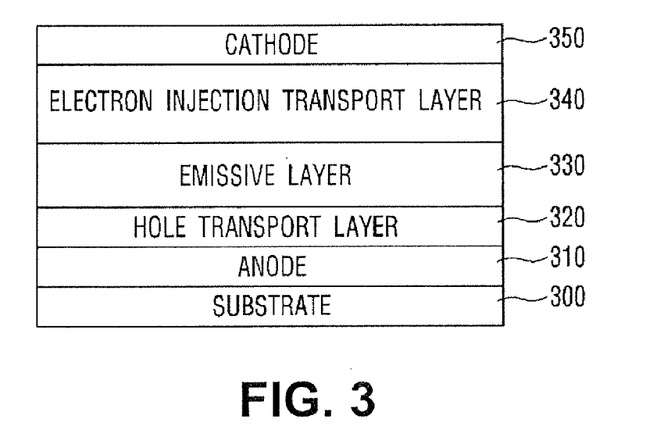
FIG. 3 is a cross sectional view of a third organic light-emitting diodes of the present invention.

FIG. 3 is a cross sectional view of a third organic light-emitting diodes of the present invention. As shown in FIG. 3, the third organic light-emitting diodes comprises a substrate 300, an anode 310, a hole transport layer 320, an emissive layer 330, an electron injection transport layer 340 and a cathode 350. The third organic light-emitting diodes is formed in the order of the substrate 300, the anode 310, the hole transport layer 320, the emissive layer 330, the electron injection transport layer 340 and the cathode 350. That is, the third organic light-emitting diodes is formed by merging the electron injection layer and the electron transport layer of the first organic light-emitting diodes into one electron injection transport layer 340.

Meanwhile, in the present invention, the third organic light-emitting diodes of FIG. 3 is implemented through the following embodiment 5. An example of the third organic light-emitting diodes will be described in the following embodiment 5.

[Embodiment 5]

Anode: manufactured with indium tin oxide (ITO) glass, deionized water, acetone and isopropyl alcohol (IPA) are put into three beakers respectively, and ultrasonic cleaning is performed for 5 minutes by an ultrasonic cleaner. Then, washing and surface treatment are performed for one hour by using an ozone ultraviolet lamp of an ozone handler.

Hole transport layer: A PEDOT:PSS solution is dropped on the ITO glass, a spin coating is performed at 2000 rpm for 40 seconds, and then a heat treatment process is performed at a temperature of 200° C. for 5 minutes on a hot plate.

Emissive layer: phenyl substituted poly_para-phenylene vinylene known as "Super Yellow" (0.65 w % into toluene) or $F_8BT$ of light-emitting polymer is added to a toluene solution of 1 w %, a spin coating is performed for 30 seconds, and then baking is performed at a temperature of 70° C. for 1 hour on a hot plate.

Electron transport/injection transport layer: After a spin coating is performed at 2500 rpm for 40 seconds on a solution formed by mixing a ZnO nanoparticle solution and a solution in which $Cs_2CO_3$ of 0.2 w % is dissolved in 2-ethoxyethanol at a volume ratio of 1:1, baking is performed at a temperature of 80° C. for 30 minutes on a hot plate.

Cathode: Silver (Ag) of 150 nm is deposited on the electron injection layer.

Figure 4:
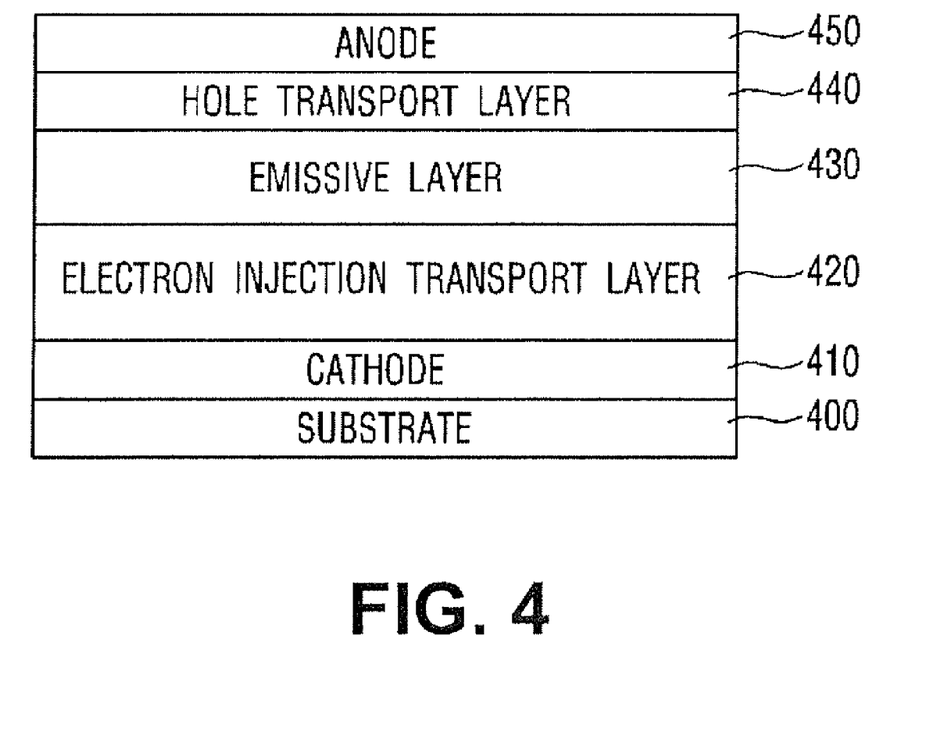
FIG. 4 is a cross sectional view of a fourth organic light-emitting diodes of the present invention.

FIG. 4 is a cross sectional view of a fourth organic light-emitting diodes of the present invention. As shown in FIG. 4, the fourth organic light-emitting diodes comprises a substrate 400, an cathode 410, an electron injection transport layer 420, an emissive layer 430, a hole transport layer 440 and an anode 450. The fourth organic light-emitting diodes is formed in the order of the substrate 400, the cathode 410, the electron injection transport layer 420, the emissive layer 430, the hole transport layer 440 and the anode 450. That is, the fourth organic light-emitting diodes is formed by merging the electron injection layer and the electron transport layer of the second organic light-emitting diodes shown in FIG. 2 into one electron injection transport layer 420.

Meanwhile, in the present invention, the fourth organic light-emitting diodes of FIG. 4 is implemented through the following embodiment 6. An example of the fourth organic light-emitting diodes will be described in the following embodiment 6.

[Embodiment 6]

Cathode: manufactured with indium tin oxide (ITO) glass, deionized water, acetone and isopropyl alcohol (IPA) are put into three beakers respectively, and ultrasonic cleaning is performed for 5 minutes by an ultrasonic cleaner. Then, washing and surface treatment are performed for one hour by using an ozone ultraviolet lamp of an ozone handler.

Electron injection transport layer: After a spin coating is performed at 2500 rpm for 40 seconds on a solution formed by mixing a ZnO nanoparticle solution and a solution in which $Cs_2CO_3$ of 0.2 w % is dissolved in 2-ethoxyethanol at a volume ratio of 1:1, baking is performed at a temperature of 80° C. for 30 minutes on a hot plate.

Emissive layer: phenyl substituted poly_para-phenylene vinylene known as "SuperYellow" (0.65 w % into toluene) or $F_8BT$ of light-emitting polymer is added to a toluene solution of 1 w %, a spin coating is performed for 30 seconds, and then baking is performed at a temperature of 70° C. for 1 hour on a hot plate.

Hole transport layer: A PEDOT:PSS solution is dropped on the ITO glass, a spin coating is performed at 2000 rpm for 40 seconds, and then a heat treatment process is performed at a temperature of 200° C. for 5 minutes on a hot plate.

Anode: Gold (Au) of 150 nm is deposited on the electron injection layer.

As described above, through the embodiments 1 to 6, the present invention provides a method using a solution process to easily form both the ionic polymer layer functioning as the electron injection layer and the ZnO nanoparticle layer functioning as the electron transport layer capable of not only avoiding a vacuum deposition method but also protecting the internal organic polymer from moisture and oxygen such that the cathode is relatively stable in the air.

The present invention is not limited to the embodiment described above and the accompanying drawings. The scope of rights of the present invention is intended to be limited by the appended claims. It will be understood by those skilled in the art that various substitutions, modification and changes in form and details may be made therein without departing from the spirit and scope of the present invention as defined by the appended claims.

What is claimed is:

1. An organic light-emitting diodes comprising:
a substrate formed of glass or a flexible plastic material;
an anode formed on the substrate;
a hole transport layer formed on the anode;
an emissive layer formed on the hole transport layer;
an electron transport layer being formed on the emissive layer and including a ZnO nanoparticle;
an electron injection layer being formed on the electron transport layer and including an ionic group; and
a cathode formed on the electron injection layer.

2. The organic light-emitting diodes of claim 1, wherein the hole transport layer is dissolved in a liquid phase by using any one of poly (3,4-ethylenedioxythiophere) poly (styrene sulfonate) (PEDOT:PSS), poly (9-vinylcarbazole) (PVK), poly (9,9-dioctylfluorenyl-2,7-diyl)-co-(4,4'(N-(4-sec-butylphenyl)) diphenylamine) (TFB), N,N'-diphenyl-N,N'-bis(1-naphthyl)-1,1'biphenyl-4,4'-diamine (a-NPD), N,N'-Bis-(3-methylphenyl)-N,N'-Bis-phenyl(1,1'-biphenyl)-4,4'-diamine (TPD), so that a solution process such as a printing process is applicable.

3. The organic light-emitting diodes of claim 1, wherein the emissive layer is either formed of any one of poly (p-phenylenevinylene) (PPV), poly (p-phenylene) (PPP), polythiophene (PT), polyfluorene (PF), poly (9.9-dioctylfluorene) (PFO) and poly (9-vinylcarbazole) (PVK) and its derivative of a polymer material, or formed of a low molecular weight material including metal complexes of Al complex series, Ir complex series or Pt complex series.

4. The organic light-emitting diodes of claim 1, wherein the electron transport layer includes a ZnO nanoparticle.

5. The organic light-emitting diodes of claim 1, wherein, after a solution is obtained by dissolving an electrolyte or an ionic surfactant including the cation and anion of an alkali metal or alkaline earth metal in a polar solvent or non-polar solvent, the electron injection layer is formed by coating the solution in a liquid phase.

6. The organic light-emitting diodes of claim 1, wherein the electron injection layer is formed by using a solution obtained by dissolving a surfactant or a polymer electrolyte in a polar solvent or non-polar solvent.

7. The organic light-emitting diodes of claim 6, wherein in the electron injection layer, an organic material which includes an alkali metal ion or an alkaline earth metal ion and salts thereof or which includes an organic cation is further added to the surfactant or a polymer electrolyte solution.

8. The organic light-emitting diodes of claim 6, wherein the surfactant is non-ionic having an ethylene oxide, and wherein the polymer electrolyte is a polymer of the surfactant, i.e., polyethylene oxide (PEO) and polyethylene glycol (PEG).

9. The organic light-emitting diodes of claim 1, wherein the electron injection layer is formed by using a metal ion, and wherein the metal ion forms the ZnO nanoparticle of the electron transport layer and compounds such as ZnO:Cs, ZnO:Li, ZnO:Mg, ZnO:Al, ZnO:Ca, ZnO:Na and ZnO:Ba.

10. The organic light-emitting diodes of claim 1, wherein the electron injection layer is formed by using an ionic polymer material having an organic material, which includes an alkali metal ion or an alkaline earth metal ion and salts thereof, or, which includes an organic cation such as an ammoniumion, as an ionic group.

11. The organic light-emitting diodes of claim 1, wherein the cathode is formed in vacuum through a deposition process by using metal ink in the form of either ionized metal or metal colloidized in a liquid and by using metal nano ink including metal nano component, and wherein the metal corresponds to any one of Ag, Al, Au, Ca, Mg, Li and Cs.

12. The organic light-emitting diodes of claim 1, wherein the cathode is formed by using a transparent metal oxide including any one of Indium Tin Oxide (ITO), Fluorine-doped Tin Oxide (FTO), Antimony Tin Oxide (ATO), Aluminum doped Zinc Oxide (AZO) and Indium Zinc Oxide (IZO) through a deposition process or a solution process.

13. The organic light-emitting diodes of claim 1, wherein the substrate is formed of a plastic material including any one of polyethylene terephthalate (PET), polyester (PES), polythiophene (PT) and polyimide (PI), or is formed of a flexible material such as aluminum foil and stainless steel foil, so that the substrate has flexibility.

* * * * *